United States Patent [19]
Nelson et al.

[11] Patent Number: 5,831,485
[45] Date of Patent: Nov. 3, 1998

[54] METHOD AND APPARATUS FOR PRODUCING A TEMPERATURE STABLE FREQUENCY USING TWO OSCILLATORS

[75] Inventors: Theodore G. Nelson, Portland; Gary M. Johnson, Hillsboro, both of Oreg.

[73] Assignee: Tektronix, Inc., Wilsonville, Oreg.

[21] Appl. No.: 923,712

[22] Filed: Sep. 4, 1997

[51] Int. Cl.$^6$ ........................................ H03L 1/02
[52] U.S. Cl. ........................ 331/47; 331/158; 331/176
[58] Field of Search .............................. 331/47, 176, 158

[56] References Cited

U.S. PATENT DOCUMENTS

| | | | |
|---|---|---|---|
| 4,344,046 | 8/1982 | Zumsteg | 331/158 |
| 4,415,870 | 11/1983 | Zumsteg | 331/158 |
| 4,443,116 | 4/1984 | Yoshida et al. | 331/176 |
| 4,537,515 | 8/1985 | Dinger et al. | 331/66 |

*Primary Examiner*—Siegfried H. Grimm
*Attorney, Agent, or Firm*—William A. Birdwell

[57] ABSTRACT

A method and apparatus for producing a temperature stable frequency at reduced cost. Advantage is taken of an existing, relatively temperature insensitive, low frequency and low cost watch crystal and an existing, high frequency, low cost, but relatively temperature sensitive system clock. A calibration module coupled to the watch crystal and clock calibrates the watch crystal to a reference frequency at a reference temperature and calibrates the clock to the watch crystal at an operating temperature, to relate the clock frequency to the reference frequency at any operating temperature and thereby provide a high precision, relatively temperature insensitive time or frequency base at low cost.

9 Claims, 2 Drawing Sheets

METHOD AND APPARATUS FOR PRODUCING A TEMPERATURE STABLE FREQUENCY USING TWO OSCILLATORS

BACKGROUND OF THE INVENTION

This invention relates to methods and apparatus employing frequency sources, such as crystal oscillators and the like, in electronic measuring apparatus. More particularly, the invention relates to producing an electrical signal having a temperature stable frequency for use in a relatively low cost digital electronic measuring apparatus, such as a hand-held digital multi-meter, for increasing the accuracy of measurements requiring a stable base of time.

It is usually a need in electronic measuring apparatus to have a reference base against which to measure time or frequency. Such bases are typically provided by oscillator circuits which are adapted to produce a signal that oscillates at a predetermined frequency. For example, counting the number of oscillations of a relatively high, fixed frequency signal that occur between the oscillations of a lower frequency signal provides a measurement of the frequency of the lower frequency signal. Similarly, counting the number of oscillations of a signal between two events provides a measurement of the time between the events. Typically, to provide for either time or frequency measurements, a resident oscillator is employed having a frequency that is assumedly temperature stable or temperature compensable. Preferably, the oscillator has a high frequency of oscillation to provide for a desired resolution in a time or frequency measurement.

However, oscillators typically do not provide high frequencies of oscillation, high temperature stability and low cost. For example, a standard quartz crystal that oscillates in the frequency range 1.5 MHz to 66 MHz and which costs about $1 may have a frequency stability of only about 100 parts-per-million over a temperature range of 0–70 degrees. To enjoy a temperature stability that is, roughly, ten times greater requires, roughly, a ten-fold increase in cost. Especially in a low cost digital electronic measuring apparatus such as a digital multi-meter ("DMM"), such a cost differential can be very important.

On the other hand, the ubiquitous crystal employed in wrist-watches ("watch crystal") is capable of providing relatively high temperature stability, e.g., 0.04 ppm/(degree C.)$^2$, at a cost much less than $1. However, the frequency of the watch crystal is a relatively low frequency of 32.768 Khz, so that the timing resolution desired in many kinds of electronic measuring apparatus is too low.

Accordingly, there is a need for a method and apparatus for producing a temperature stable frequency at reduced cost, especially for use in a low cost digital electronic measuring apparatus such as a DMM.

SUMMARY OF THE INVENTION

The method and apparatus for producing a temperature stable frequency at reduced cost of the present invention solves the aforementioned problems and meets the aforementioned needs by providing, preferably in a low cost digital electronic measuring apparatus such as a DMM, a relatively temperature insensitive, low frequency and low cost first oscillator and a high frequency, low cost, but relatively temperature sensitive second oscillator. According to the invention, a calibration module is coupled to the first oscillator and the second oscillator. The calibration module is adapted for calibrating the frequency of the first oscillator with the frequency of a reference signal at a reference temperature, and for calibrating the frequency of the second oscillator with the frequency of the first oscillator at an operating temperature which, in general, is not equal to the reference temperature. Because the frequency of oscillation of the first oscillator is presumed to have a negligible temperature dependence, the frequency of the second oscillator is thereby relatable, at the desired operating temperature of the apparatus, to the known frequency of the reference signal. Employing the relatively high frequency second oscillator as a time or frequency base provides the benefit of high resolution, while calibrating the second oscillator to the first oscillator provides the benefit of temperature stability, all at low cost.

Therefore, the present invention provides a novel and improved method and apparatus for producing a temperature stable frequency at reduced cost. An outstanding advantage of the use of this method and apparatus over the prior art are a greater frequency resolution and temperature stability at the same or lower cost. It is particularly advantageous that the subject method and apparatus is suitable for use in an existing, hand-held DMM. The foregoing and other aspects, features and advantages of the present invention will be more readily understood upon consideration of the following detailed description of the invention, taken in conjunction with the following drawings.

DETAILED DESCRIPTION OF A PREFERRED EMBODIMENT

Figure 1:
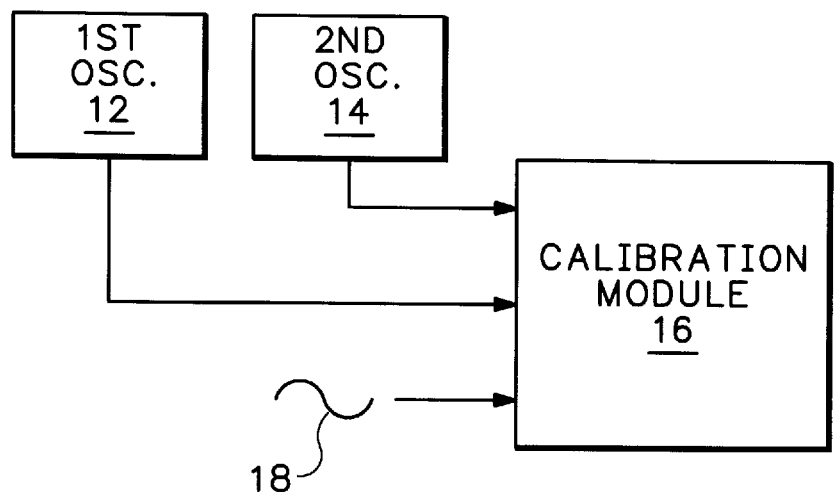
FIG. 1 is a block diagram of an apparatus for producing a temperature stable frequency at reduced cost, according to the present invention.

Referring to FIG. 1, an apparatus 10 for producing a temperature stable frequency according to the present invention is most advantageously employed in cost-sensitive applications, such as in a hand-held DMM wherein, however, it is desired to retain the capability to resolve small increments of time or frequency and, therefore, to provide a relatively high frequency clock for measuring the time or frequency.

Accordingly, rather than employ a single high cost, high frequency, temperature stable clock as is typical in the prior art, the apparatus 10 employs two clocks: a low cost, low frequency, temperature stable first oscillator 12 and a low cost, high frequency, temperature sensitive second oscillator 14. For tying the oscillators together, the apparatus 10 includes a calibration module 16.

The calibration module 16 is adapted for (1) calibrating the frequency of the first oscillator 12 with a reference frequency signal 18 having a known reference frequency at a reference temperature, and (2) for calibrating the frequency of the second oscillator 14 with the frequency of the first oscillator 12 at an arbitrary operating temperature of the apparatus 10 which is, in general, different from the reference temperature. Where the frequency of oscillation of the first oscillator 12 is presumed to have a negligible temperature dependence, the frequency of the second oscillator is thereby relatable, to the known frequency reference signal.

Figure 2:
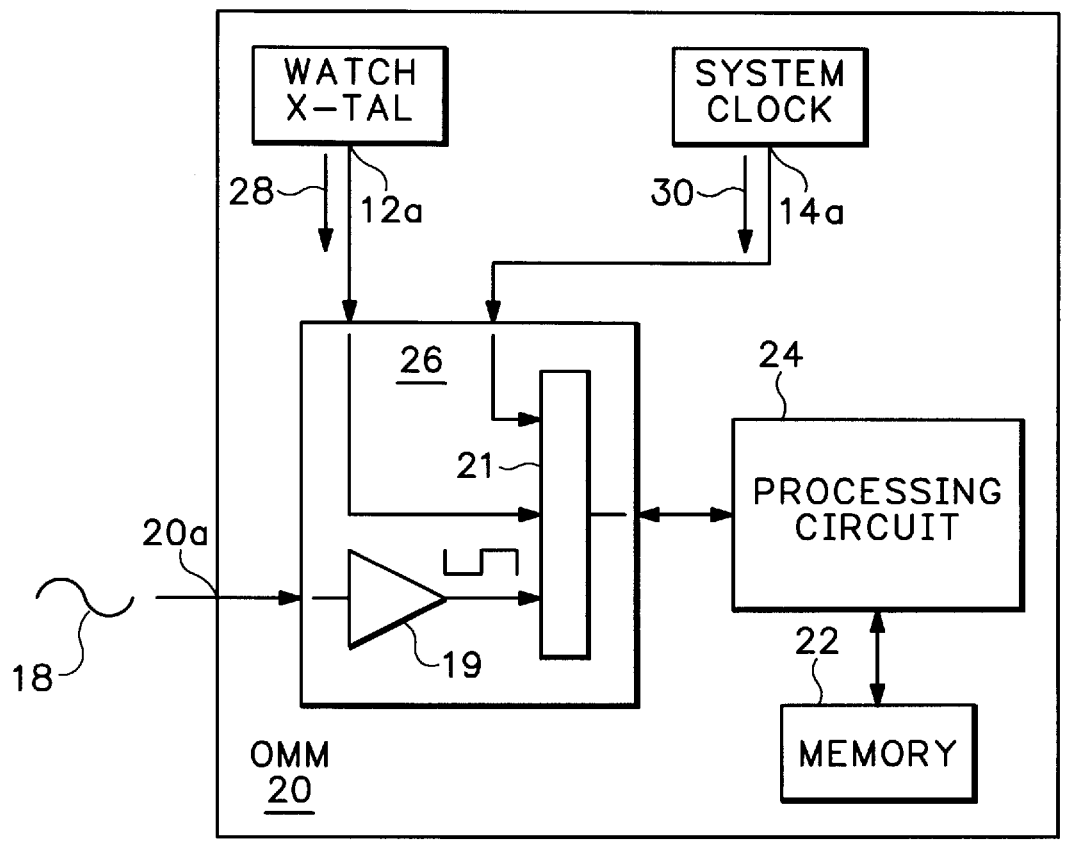
FIG. 2 is a block diagram of the apparatus as implemented in a low cost digital electronic measuring apparatus, according to the present invention.

Referring to FIG. 2, the aforedescribed elements are preferably formed from hardware pre-existing in a low cost digital electronic measuring apparatus, such as a DMM 20. The existing DMM 20 typically includes an electrical input 20a for receiving an electrical signal for calibration or measurement, a comparator 19 and counter 21 referred hereinafter as a counter 26, coupled to the input for producing counts of the number of cycles of the signal or signals provided to the input, a memory 22, and a processor 24 coupled to the memory and the counter for reading the counts and the data stored in the memory, manipulating the counts and data and writing the manipulated counts and data to the memory.

As do many electronic devices, the DMM 20 typically includes a watch crystal for providing a time base from which to measure and report the time of day. It is advantageous to employ this existing structure as the first oscillator 12. The frequency of the oscillator 12 is then substantially about 32.768 Khz, which is too low to provide for desired resolution for measuring signal parameters in the DMM.

The DMM also includes a system clock for clocking the processing circuit 24, such as a ceramic resonator, the system clock having a frequency in the megahertz range. While low cost versions of such system clock circuits are typically temperature sensitive, this temperature sensitivity is not of great importance to the function of clocking for the processor. The present invention recognizes the advantage of employing this structure as the second oscillator 14, and of employing the first oscillator 12 to substantially reduce the temperature sensitivity of the second oscillator.

The first oscillator 12 has an output 12a through which is provided a time base signal 28 of about 32.768 Khz to the processing circuit 24. The second oscillator 14 has an output 14a through which is provided a clock signal 30 to the processor, the clock signal being employed to clock the processor. The counter 26 is coupled to the outputs 12a and 14a of the first and second oscillators, and to the input 20a of the DMM, for receiving and converting the signals 28, 30 and 18 respectively, as well as the subject signals, to a digital form for processing in the processor.

The processor 24 includes logic circuitry for executing a computer program adapted for reading data generated by the counter 26 and from the memory 22, arithmetically operating on the data, and writing the results to the memory for subsequent use or for display to a user. The invention takes advantage of the memory, the processor and the counter by employing these components as the calibration module 16.

Figure 3:
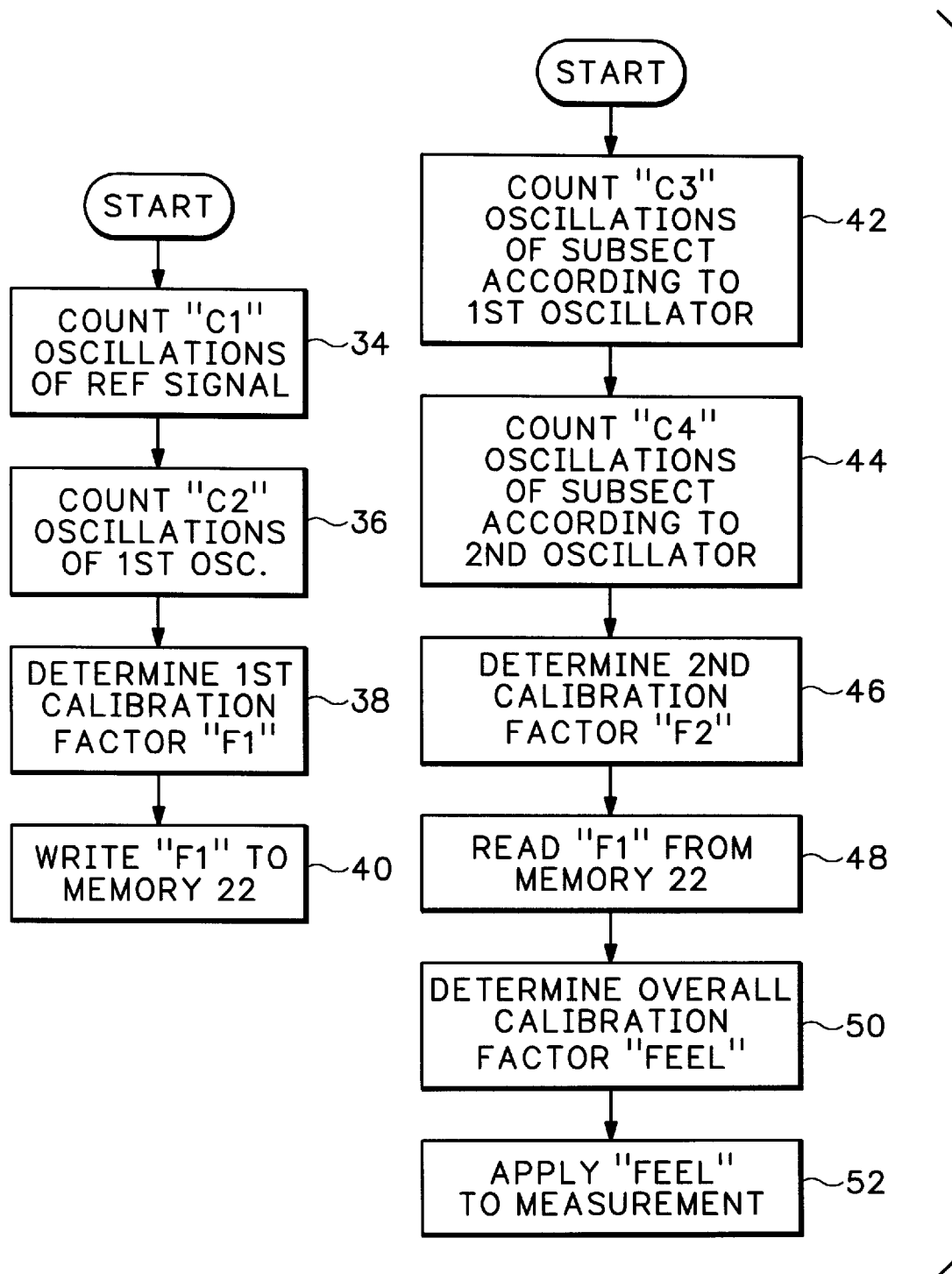
FIG. 3 is a flow chart of a method for producing a temperature stable frequency at reduced cost, according to the present invention.

The aforedescribed hardware is employed to produce a temperature stable frequency at reduced cost. Referring to FIG. 3, in step 34 beginning a reference calibration, the counter 26, in conjunction with the processor 24, produces a first count "C1" of the number of oscillations at the reference temperature "Tref" of the reference signal 18 that occur in a predetermined time, such as defined by a predetermined number of oscillations of the clock signal 30 of the second oscillator 14. The frequency of the clock signal may be greater than the frequency of the reference signal, less than the frequency of the reference signal, or equal to the frequency of the reference signal. Regardless of the relationship of the frequencies of the two signals, the first count "C1" will be the number of oscillations of the clock signal that occur in a predetermined number of oscillations of the reference signal. The count "C1" corresponds to the measured frequency of the reference signal at the reference temperature.

Also at the reference temperature, in step 36, the counter 26 produces a second count "C2" of the number of oscillations of the time base signal 28 of the first oscillator 12 that occur in a substantially identical time, such as during the same number of oscillations of the clock signal 30 employed for the count "C1." The count "C2" corresponds to the measured frequency of the time base signal at the reference temperature. As will be appreciated, it is not necessary that the value of the reference temperature be known to perform the step 36.

In a calibration step 38, the processor 24 determines a calibration factor "F1" by comparing the count "C1" and the count "C2", such as by dividing one of the counts into the other. The factor "F1" correlates the frequency of the time base signal and the frequency of the reference signal 18. It will then be assumed either that (1) the changes or error in the frequency of the time base signal that would result from changing the temperature of the DMM 20 is negligible for purposes of the measurement, or (2) the manner in which the relatively small error increases with temperature excursions from the reference temperature is well known, easily characterized, and may be easily compensated for, to achieve even greater accuracy. Accordingly, however, it should be appreciated that it is preferable to select the reference temperature to lie at the statistical median or mode of the temperatures contemplated for use with the DMM.

In step 40, the processor writes the calibration factor "F1" to the memory for storage for later use. All of the aforementioned steps are, generally, most advantageously performed during manufacture of the DMM, and the factor "F1" may be incorporated in ROM or other non-volatile memory resident in the memory 22. However, the aforementioned steps may be performed during use of the DMM 20 as well, and the factor "F1" may be stored in either volatile memory or non-volatile memory by the user as desired.

In measuring subject signals, in step 42, the counter 26 produces a third count "C3" of the number of oscillations of the subject signal over a predetermined time, by counting the number of oscillations of the time base signal 28 over the predetermined time. The predetermined time may be conveniently represented by a predetermined number of oscillations of either the time base signal or the clock signal 30, or may be determined from some other time base.

Similarly and conceptually in parallel, in step 44, the counter produces a fourth count "C4" of the number of oscillations of the subject signal by counting the number of oscillations of the clock signal 30 over the same predetermined time.

In step 46, the processor determines a second calibration factor "F2" by comparing the counts "C3" and "C4", such as by dividing one of the counts into the other. The second calibration factor correlates the frequency of the second oscillator 14 and the frequency of the first oscillator 12 at the operating temperature.

To relate the frequency of the clock signal at the operating temperature to the frequency of the reference signal, in step 48, the processor 24 reads the first calibration factor "F1" from the memory circuit 22. Then, in a final calibration step 50, the processor determines an overall calibration factor "Fcal" relating the frequency of oscillation of the second oscillator 14 at the operating temperature to the reference frequency provided to the apparatus 10 at the reference temperature. Particularly, the processor compares the second calibration factor "F2" with the first calibration factor, such as by multiplying the calibration factors. The processor then, in a frequency correcting step 52, applies "Fcal" to the measurement to correct the measurement for frequency drift in the oscillator 14.

As just one example of the aforedescribed comparisons, consider that step 38 includes forming the ratio "C1/C2=F1", and step 46 includes forming the ratio "C3/C4=F2". Then, "Fcal=F1×F2", and a measurement of frequency obtained by counting the number of oscillations of the clock signal should be multiplied by "Fcal" to adjust for frequency error in the clock signal. Equivalent formulations will be apparent to those of ordinary skill.

In measurement step 56, the overall calibration factor "Fcal" is applied to a measured value of time or frequency that is determined in the apparatus 10 using the oscillations of the second oscillator 14 as a base, to correct for temperature variation error in the frequency of the second oscillator. Thereby, the apparatus obtains a low cost measurement of time or frequency that is relatively insensitive to the difference between the operating temperature and the reference temperature.

Though it is advantageous to employ the aforedescribed hardware as it typically exists in low cost electronic measuring apparatus, it will readily be appreciated by those of ordinary skill that the aforedescribed functions may be performed with equivalent circuits without departing from the principles of the invention.

Although the frequency of oscillation of the watch crystal has a relatively small temperature coefficient, its temperature dependence varies substantially as the square of temperature. However, the magnitude of drift remains small over reasonable ranges of temperature. As an example, consider a representative watch crystal having a temperature drift about 0.04 ppm/(degree C.)$^2$, and an inexpensive system clock having a high temperature drift. For a 10 degree C. change in temperature, the watch crystal will have a temperature drift 100 times less than that of the system clock. Even for a temperature change as much as 100 degrees C., the watch crystal provides far less frequency error than does the system clock. In the DMM, the square dependence of frequency drift with temperature of the watch crystal is particularly mitigated because the DMM is often specified to operate within a relatively narrow temperature range, such as +/−5 degrees C.

An additional benefit of the present invention when employing the watch crystal is that the frequency deviation with temperature thereof is well known. Therefore, in an alternative embodiment of the invention, the apparatus 10 may employ a compensation module coupled to the first oscillator 12 in which the temperature is measured and the frequency of oscillation of the first oscillator is compensated by well known techniques. In particular, a device having properties that change nearly linearly with temperature, such as the 2 mv/degree C. voltage across a diode junction, may be employed where the voltage is initially calibrated at the reference temperature, and stored in the memory circuit 22.

It is to be recognized that, while a specific method and apparatus for producing a temperature stable frequency at reduced cost has been shown as preferred, other configurations could be utilized, in addition to configurations already mentioned, without departing from the principles of the invention. For example, while the components of an existing DMM are advantageously employed for the purposes described herein, other or additional components may be employed as known in the art without departing from the principles of the invention. As a particular example, an existing or additional analog-to-digital converter may be employed in conjunction with a processor for producing the counts C1–C4.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

We claim:

1. In a low cost digital signal measuring apparatus having a first oscillator adapted for producing a first signal at a relatively low first frequency, the first frequency having a first predetermined temperature dependence, and a second oscillator adapted for producing a second signal at a relatively high second frequency, the second frequency having a second predetermined temperature dependence which is substantially greater than the first, a method for producing a temperature stable frequency, comprising the steps of:

determining a first calibration factor by counting a first number of oscillations of a reference signal and a second number of oscillations of the first signal over a substantially identical period of time at a reference temperature, and comparing said first number and said second number;

determining a second calibration factor by counting a third number of oscillations of the first signal and a fourth number of oscillations of the second signal over a substantially identical period of time at an operating temperature, and comparing said third and said fourth number; and relating the number of oscillations of the second signal at said operating temperature to a corresponding number of oscillations of the reference signal by comparing said first calibration factor and said second calibration factor.

2. The method of claim 1, wherein said step of comparing said first and said second number of oscillations includes dividing said first number by said second number, wherein said step of comparing said third and said fourth number of oscillations includes dividing said third number by said fourth number, and wherein said step of comparing said first calibration factor and said second calibration factor includes multiplying said first calibration factor by said second calibration factor.

3. The method of claim 1, wherein said step of comparing said first and said second number of oscillations includes dividing said second number by said first number, wherein said step of comparing said third and said fourth number of oscillations includes dividing said fourth number by said third number, and wherein said step of comparing said first calibration factor and said second calibration factor includes multiplying said first calibration factor by said second calibration factor.

4. The method of claim 1, further comprising the step of temperature compensating the first oscillator.

5. A circuit for producing a temperature stable frequency, comprising:

an electrical input adapted for receiving an electrical signal;

a first oscillator adapted to provide a first signal of relatively low frequency to said electrical input, the frequency of said first signal having a first predetermined temperature dependence;

a second oscillator adapted to provide a second signal of relatively high frequency to said electrical input, the frequency of said second signal having a second predetermined temperature dependence which is substantially greater than said first predetermined temperature dependence;

a memory circuit, adapted for storing a predetermined first calibration factor relating the frequency of oscillation of said first signal to the frequency of oscillation of a reference signal at a first predetermined temperature;

a calibration module having a calibration input and an output, said calibration input being coupled to said electrical input and said output being coupled to said memory circuit, for calibrating the frequency of the second oscillator with the frequency of the first oscillator at an arbitrary operating temperature, wherein said calibration module is adapted to count the number of oscillations of said first signal and said second signal over a substantially identical period of time, read from said memory circuit said first calibration factor, compare said number of oscillations of said first signal and said number of oscillations of said second signal to form a second calibration factor, and relate the frequency of oscillation of said second signal to the frequency of said reference signal at said operating temperature by comparing said first calibration factor and said second calibration factor.

6. The circuit of claim 5, wherein said calibration module is adapted to compare said first calibration factor and said second calibration factor by dividing one of said first calibration factor and said second calibration factor into the other.

7. The circuit of claim 5, wherein said calibration module is adapted to count the number of oscillations of said first signal and said reference signal over a substantially identical period of time, and compare said number of oscillations of said first signal and said number of oscillations of said reference signal to form said first calibration factor.

8. The circuit of claim 7, wherein said calibration module is adapted to compare said number of oscillations of said first signal and said number of oscillations of said reference signal by dividing one of said number of oscillations of said first signal and said number of oscillations of said reference signal into the other.

9. The circuit of claim 8, further comprising a temperature compensation module coupled to the first oscillator and adapted to compensate the frequency of the first oscillator for changes in the operating temperature thereof.

* * * * *